United States Patent [19]

Dean

[11] 4,061,969

[45] Dec. 6, 1977

[54] APPARATUS FOR TESTING PRINTED CIRCUIT BOARDS

[75] Inventor: Anthony James Dean, Congleton, England

[73] Assignee: International Computers Limited, London, England

[21] Appl. No.: 683,684

[22] Filed: May 5, 1976

[30] Foreign Application Priority Data

May 17, 1975 United Kingdom ............... 21094/75

[51] Int. Cl.$^2$ .......................................... G01R 15/12
[52] U.S. Cl. ............................ 324/73 PC; 324/73 R; 324/158 F; 324/158 P
[58] Field of Search ........... 324/73 R, 73 AT, 73 PC, 324/158 F, 158 P, 158 R

[56] References Cited

U.S. PATENT DOCUMENTS

| 3,714,572 | 1/1973 | Ham et al. | 324/158 F |
| 3,723,867 | 3/1973 | Canarutto | 324/73 PC |
| 3,757,219 | 9/1973 | Aksu | 324/158 F |
| 3,970,934 | 7/1976 | Aksu | 324/158 F |

OTHER PUBLICATIONS

Multipoint Test Probe for Printed Cards, U. Renz, IBM Tech. Dis. Bull., vol. 17, No. 2, July 1974, pp. 459-460.

Primary Examiner—Rudolph V. Rolinec
Assistant Examiner—Vincent J. Sunderdick
Attorney, Agent, or Firm—Hane, Roberts, Spiecens & Cohen

[57] ABSTRACT

The printed circuit board testing apparatus includes resiliently loaded probe pins carried in a support so that the pins can individually move relative to the support. A sealing means is positioned between the support and the printed circuit board, and is effective in operation to form a closed boundary enclosing a space occupied by the probes and the circuit connections and to enable a pneumatic clamp seal to be produced between the sealing means and the circuit board, to hold the probe pins in contact with the circuitry of the board.

12 Claims, 4 Drawing Figures

APPARATUS FOR TESTING PRINTED CIRCUIT BOARDS

BACKGROUND OF THE INVENTION

1. Field of the Invention

The present invention relates to apparatus for testing printing circuit board assemblies and in particular to such apparatus incorporating probes arranged to engage connections of the circuit boards to permit test and evaluation apparatus to be connected thereto.

2. Description of the Prior Art

It has previously been proposed to provide test probe arrangements to permit the evaluation of connections of circuit boards before assembly. However, the testing of such boards after assembly has proved difficult in that the insertion and soldering of components on the boards produces an irregular surface to which it is difficult to provide a reliable and readily established temporary connection. Similarly it has also been proposed to provide apparatus for attachment to integrated circuit components within the limit of a circuit board, such apparatus having connecting arrangements suitable for ready connection to the lead wires of contacts of the integrated circuit elements. The assembly of such elements into a circuit board usually requires the lead wires to be formed so as to pass through holes in the circuit boards and the previously known arrangements for establishing connections with such circuit elements have usually consisted of clip arrangements intended to embrace the integrated circuit elements. Typical of such arrangements are so-called DILIC clip testers, intended for the connection of test wiring to integrated circuit elements of the kind known as "dual in-line integrated circuit" packages However, as the physical size of these elements has varied and as the packing density of such elements on a circuit board has increased it has become increasingly difficult to produce a reliable test clip of sufficiently small dimensions to be accommodated on a fully assembled circuit board.

SUMMARY OF THE INVENTION

According to the present invention, there is provided apparatus for testing electrical installations on a planar circuit board which presents on a surface thereof a pattern of connections, the apparatus including; a group of probe members connectable to a circuit evaluation means; a plate like support means for mounting the probe members in alignment with each other such that the probe members conform to the pattern, and such that the probe members are individually displaceable with respect to the support means along the direction towards and away from the connections; sealing means locatable between the support means and the circuit board and effective in operation to form a closed boundary enclosing a space occupied by the probe and the connections and to enable a pneumatic clamp seal to be effected between the boundary and the circuit board thereby to maintain the support means and thus the probe members in the desired position with respect to the circuit board.

BRIEF DESCRIPTION OF THE DRAWINGS

Apparatus embodying the invention will now be described, by way of example, with reference to the accompanying drawings, in which.

DESCRIPTION OF PREFERRED EMBODIMENT

Figure 1:
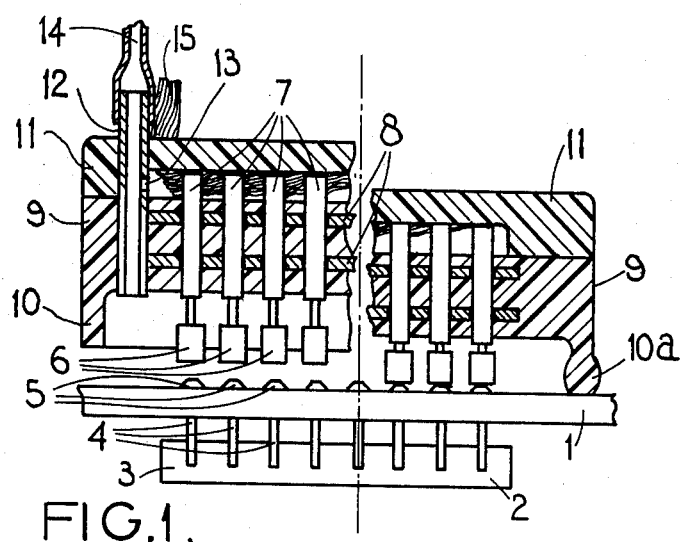
FIG. 1 is a composite drawing, partly in section, illustrating the application of a test probe arrangement to a printed circuit board assembly.

Referring now to FIG. 1, a printed circuit board 1 carries an integrated circuit element 2 of the kind known as a dilic or dual in-line integrated circuit. The circuit is encapsulated within a block 3 of insulating material. External connections to the circuit are formed from conductive strips 4 arranged in line along two opposite sides of the block 3. The strips 4 are bent at right angles so that they all project on the same side of the block 3, forming two parallel lines of connection strips. The printed circuit board 1 has holes for receiving the strips 4. Soldered connections 5 are established between the strips 4 and the board 1 on that side (the upper side as shown in the drawing) of the board 1 remote from the block 3.

This method of assembling circuit elements 2 to a circuit board 1 is conventional and previous test apparatus has required the application of connection clips to the strips 4 the test clips usually being formed to embrace the entire block 3.

In the present case (FIG. 1) a test probe arrangement is applied to the soldered connection side of the board 1 and consists of a group of individual test probes 6 carried in guides 7 supported in boards 8. The guides 7 are arranged in a pattern to conform to the soldered connections 5.

The boards 8 and those parts of the guides 7 passing through them are encapsulated in a support block 9 of soft resilient insulation material, such as silicone rubber. The lower part of the block 9 has a peripheral skirt or seal 10 surrounding the probes 6. A cap 11 of similar material covers the block 9 and seals the ends of the guides 7. A pipe 12 is provided through the cap 11 and the block 9 to permit the venting to the space within the seal 10. A hole 13 in the pipe 12 similarly permits venting of the interior of the cap 11. A flexible tube 14 connects the pipe 12 to a vacuum pump (not shown).

Each of the probes 6 is individually connected by soldering to an insulated flexible wire 15. The wires 15 are led out of the cap 11 to permit the probes to be connected to circuit evaluation apparatus (not shown).

Figure 2:
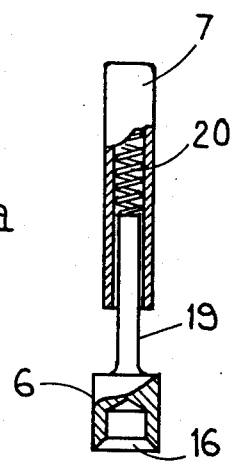
FIG. 2 is a view, partly in section, of a test probe.

The probes 6 are hollow ended, the hollow ends having a sharp boundary edge 16. (FIG. 2). Each probe 6 has a stem 19 freely slidable within its guide 7. Each probe 6 is loaded by means of a compression spring 20 within the associated probe guide 7.

The quiescent initial state of the test probe arrangement is illustrated in the left-hand upper part of FIG. 1. In this state the probes 6 are extended from the guides 7 by the springs 20 so that they project below the skirt 10. While in this state the arrangement is, in operation, positioned relative to the circuit board 1 so that the probes 6 are aligned each with an appropriate one of the connections 5. The entire test probe arrangement is then moved (downwards as shown in FIG. 1) towards the circuit board.

Initially this movement causes the probes 6 to engage the connections 5. Continued movement brings the seal 10 into contact with the board 1. At this point the vacuum pump (not shown) commences to exhaust air from the space within the seal 10 between the support block 9 and the board 1.

Exhaustion of air from this space creates a differential atmospheric pressure in that the local atmosphere within the space inside the seal 10 is at a lower pressure than the ambient atmosphere outside the sealed space. Consequentially higher external pressure acts to urge the entire probe arrangement still more firmly towards the board 1 to produce a pneumatic clamping effect. As differential pressure increases the arrangement assumes the attitude illustrated in the right-hand upper part of FIG. 1 in which the seal has bulged as indicated at 10a to grip or clamp against the board 1 sufficiently firmly to support the entire arrangement against displacement. At the same time, the movement of the arrangement towards the board 1 as the pressure differential is built up causes the probes 6 to be pushed into the guides 7, thereby deforming the springs 20 to load the probes 6 to a degree determined by the characteristics of the springs, so as to establish good electrical contact between the probes 6 and the connections 5.

Figure 3:
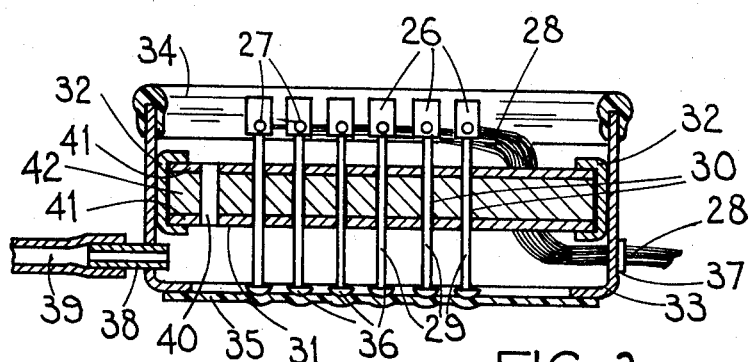
FIG. 3 is a sectional view of an alternative form of test probe arrangement.

An alternative arrangement of the probes and guides, is shown in FIG. 3. In this arrangement, probes 26 are formed with sharp connection-engaging edges as described above and also have holes 27 into which wires 28 are connected, e.g. by soldering. The stems 29 of the probes 26 are guided and supported in holes 30 of a composite support member 31, consisting of a sandwich formed by a pair of boards 41 enclosing a filler layer 42. The member is supported by channels 32 secured, for example, by screws (not shown) passing through sidewalls of a tray 33. The rim of the tray 33 carries a seal 34 of resilient material. The floor of the tray 33 is open and is replaced by a flexible membrane 35 bridging the opening. The membrane 35 supports the free ends of the probe stems 29, which are provided with mushroom heads 36.

The wires pass through an airtight seal 37 in the sidewalls of the tray 33. A pipe 38 is provided for the attachment of a tube 39 from a vacuum pump (not shown). A hole 40 is provided in the support 31 to allow air to pass from one side of the support to the other. If desired a single layer porous support 31 could replace the sandwich structure shown provided that it is sufficiently stable to act as a guide and support for the probe stems 29. In this case the airway provided by the hole 40 would not be required.

In operation, the probes 26 are aligned with connections, such as the connections 5 of FIG. 1, on a printed circuit board in a manner similar to that described earlier. The entire arrangement of FIG. 3 is then moved towrrds the printed circuit board so that the seal 34 contacts the board to isolate the internal air space from the ambient atmosphere outside the sealed space and the vacuum pump (not shown) the evacuates air from the enclosure. As before, the differential atmospheric pressure then holds the entire probe arrangement by a pneumatic clamping effect against the circuit board against displacement. As the same time, the membrane 35 is deformed by the external pressure and acts directly on the ends 36 of the probe stems 29 to load the probes 26 to ensure good electrical contact with the connections of the printed circuit board.

In both the embodiments described above, a dilic test probe arrangement is provided which, by contacting the reverse side of a printed circuit board from that on which the dilics are mounted, avoids problems, such as the accurate formation of the dilic leads themselves or the provisions of sufficient space around each individual dilic of a fully assembled board for the use of surface clip contactors, which have formerly been associated with the in situ testing of assembled dilics. These proposals also have an advantage in that impromptu testing devices may readily and cheaply be arranged by the use of blank unassembled printing circuit boards bearing an appropriate hole pattern to provide the supports or guideways for the probes. Thus the boards 8 or 41 are readily prepared by drilling out existing connection holes in suitable printed circuit board portions and these portions are either cast into a silicone rubber compound using a standard mould (in the case of the example of FIG. 1) or are sandwiched with a filler which can have its centre removed entirely (in the case of the example of FIG. 3). Where the guides 7 are not sealed into the board positions by the silicone rubber portion of FIG. 1, it will of course, be necessary to seal the wires to the outer cap 11 of the shroud.

Figure 4:
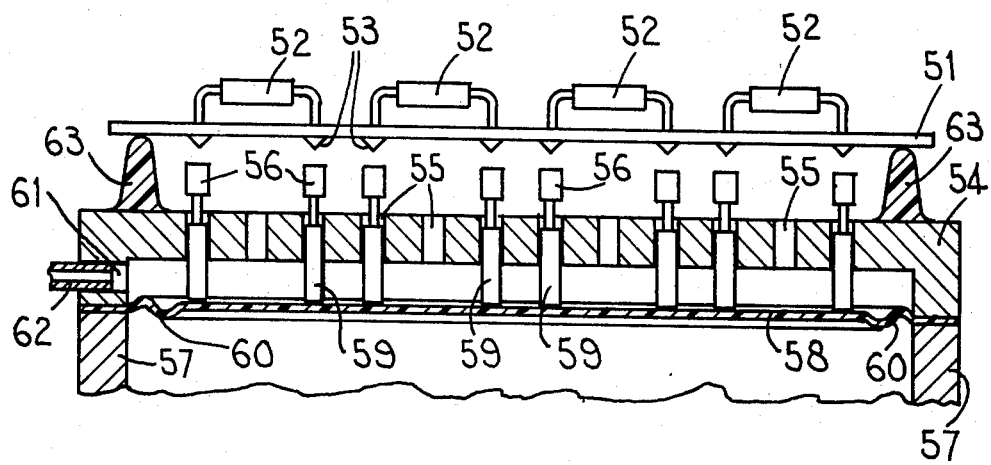
FIG. 4 is a part-sectional view of a further test probe arrangement illustrating its application to a circuit board assembly.

The use of differential air pressure for the concurrent retention in engagement of test probes and connections on an assembled circuit board and the loading of the test probes is not confined, however, to dilic testers. As shown in FIG. 4 a test probe arrangement may be used in conjunction with a complete circuit board. The board 51, as shown, carries a group of components 52, such as dilic elements, whose leads are passed through holes in the board 1 and secured by soldered connections 53 in the conventional manner.

The test probe arrangement has a top plate 54 of insulating material with an array of holes 5. Spring loaded test probes 56 in guides 59, of the kind shown in detail in FIG. 2, are inserted in those holes 55 which correspond in position to the pattern of connections 53 of the circuit board to be tested. Any vacant holes 55 provide air passages through the top plate 54. The edges of the top plate 54 are turned down to seat on side walls 57 of a base structure. A flexible membrane 58 passes completely under the top plate 54 and is sealed between the top plate 54 and the base structure walls 57, leaving a spaced beneath the top plate 54. The lower ends of the probe guides 59 are supported by the membrane 58.

Corrugations 60 are formed round the edges of the membrane 58 within the sidewalls 57. An air channel 61 is provided through the top plate 54 and a tube 62 extends from the channel 61 for connection to a vacuum pump (not shown). A resilient seal 63, for example of silicone rubber, is provided on the top plate 54. The circuit board 51 to be tested on the seal 63. Connecting wires from the probes 56 are omitted from the drawing in the interests of simplicity and clarity.

In operation, the circuit board 51 is laid upon the seal and its connections 53 are aligned with the probes 56. The alignment operation is, in practice, facilitated by registration pegs (not shown) projecting from the top plate, preferably outside the area enclosed by the seal 63 to avoid the necessity for providing individual seals, which closely engage mating holes in the circuit board. The vacuum pump is then turned on and air is exhausted from the underside of the top plate 54 and from the space enclosed by the seal 63 between the top plate 54 and the circuit board 51.

The differential atmospheric pressure then created causes the area of membrane 58 within the corrugations to move upwards as shown in the drawing, the corugations flexing to permit this movement. This upward movement first lifts the guides 59 to bring the probes 56 into contact with the connections 53 and then continues the upward movement to deform the springs within the guides 59 (as best shown in FIG. 2) to load the probes 56 with the required predetermined contact pressures. At the same time the external atmospheric pressure acting on the circuit board 51 itself ensures that the board 51 is firmly seated on the seal 63 to maintain the alignment of the connections 53 with the probes 56 against displacement.

In connection with the provision of the holes 55 in the top plate 54 it is convenient, in order to avoid having to provide a separate top plate for testing boards of different component layouts, to adopt an arrangement in which holes 55 are provided on a universal grid, as many as, say eight thousand holes being provided in a one hundred by eighty matrix. Then as many as say three or four thousand probes 56 may be provided and inserted in the top plate 54, the probes 56 being distributed in the top plate 54 in a pattern determined by the component layout of the circuit board, it being then a requirement that all component connections 53 shall be arranged in a pattern conforming to the universal grid adopted for the possible positions of probes in the top plate 54. Hence there will, under these circumstances always be some vacant holes 55 in the top plate 54. At the same time it will be realised that probes 56 which are not required for the particular test may be inserted into holes which do not correspond to connection positions. Using this arrangement it is desirable to provide a conventional patchboard between the probe wiring and the testing and evaluation apparatus which is used to control the testing of the assembled circuit board.

The form of the probe used in connection with the above described apparatus can take various forms for example the probe tips can have sharp points, cone shaped points, castellation shapes domed etc.

I claim:

1. Apparatus for testing electrical installations on a planar circuit board which presents on a surface thereof a pattern of connections, the apparatus including; a group of probe members connectable to a circuit evaluation means; a plate like support means for mounting the probe members in alignment with each other such that the probe members conform to the pattern, and such that the probe members are individually displaceable with respect to the support means along the direction towards and away from the connections; sealing means connected with the support means, and effective in operation to form a closed boundary enclosing a space occupied by the probes and the connections and to enable a pneumatic clamp seal to be effected between the boundary and the circuit board thereby to maintain the support means and thus the probe members in a desired position with respect to the circuit board; a wall provided around the periphery of the support means to form therewith a cup like housing for the probe members and to co-operate with the space, deformable means associated with said chamber and co-operable with an air path between the chamber and space and a means for producing within the space and chamber a pressure which is lower than that outside the boundary of the space so as to produce the pneumatic clamp effect when the seal is contacted with a board and also to cause the deformable means to load each probe into engagement with the circuit connections.

2. Apparatus as claimed in claim 1, in which the deformable means includes a membrane element effective after said clamp seal has been effected to act on each probe member to displace same with respect to the support means into a desired electrical contact condition with the connections.

3. Apparatus as claimed in claim 1, in which the support means provides a separating wall between said space and a closed housing having the deformable means on a wall thereof that faces the support means; and in which the probe members project to opposite sides of the support means whereby the deformable means is arranged to be contactable with the probe members to be able to displace the probe members to their contact forming condition following the completion of the clamp seal.

4. Apparatus as claimed in claim 3, in which the deformable means comprises a movable membrane and in which the probes, have a rest position in which they bear against the membrane.

5. Apparatus for testing electric circuit boards presenting on a surface thereof a pattern of connections, the apparatus comprising
   a. a group of probe members connectable to circuit evaluation means;
   b. a plate like support means for mounting the probe members in alignment with each other in such positions that the probe members conform to said pattern with the probes individually displaceable with respect to the support means and having portions projecting from at least one side of the support means;
   c. means defining an airtight chamber to said one side of the support means;
   d. a wall in said chamber which is positioned so as to be co-operable with the projecting portions of the probe members, said wall being so adapted for displacement with respect to the support means as to be able correspondingly to displace the probe members relative to the support means outwardly from the other side of the support means;
   e. seal means locatable between the periphery of said other side of the support means and the circuit board and effective in operation to define a closed boundary enclosing said connections and defining a space occupied by the connections and within which the probe members are displaceable;
   f. first means providing an air pressure transfer path from one side of the support means to the other side thereof;
   g. second means providing an air pressure transfer path into said chamber whereby on applying the apparatus to a circuit board, with the seal means between the support means and the board, and then applying suction to the second air transfer means a pneumatic clamp seal is produced by the seal means to clamp the support means with respect to the circuit board and secondly to cause said wall to move relative to the support means thereby to advance the probe members into contact with said connections.

6. Apparatus as claimed in claim 5, in which said air tight chamber is constituted by a cup-like housing having a portion which extends around and connects with the periphery of the support means, and a base connected with said portion, said base providing said wall for contacting the probes.

7. Apparatus as claimed in claim 6, in which said portion extends from said other side of the support means to provide a rim which defines at least in part said space, and in which said seal includes a deformable ring member provided upon the rim.

8. Apparatus as claimed in claim 5, in which said base in constituted by a flexible membrane.

9. Apparatus as claimed in claim 5, in which each probe member includes a pin element, a guide element within which the pin element is axially displaceable and resilient means for urging the pin element to an exposed quiescent position and at least one plate in which said guide elements are positionally supported to conform to said pattern the plate being encapsulated in an elastomeric block which is thus reinforced by the plate to define said support means.

10. Apparatus as claimed in claim 9, in which the block includes a peripheral skirt extending from said one side, said skirt providing said seal means.

11. Apparatus as claimed in claim 9, in which said chamber is defined by providing a cup having a base and a skirt of elastomeric material, said skirt being connected to the elastomeric block, in such manner as to provide an air tight seal between the cup skirt and the block and such that the base thereof is co-operable with all of the guide elements at the ends thereof remote from the ends from which said elements project.

12. Apparatus as claimed in claim 6, in which said base of the chamber is defined by a flexible membrane having a central portion co-operable with the probe members, a peripheral portion mechanically connected to said wall, and a corrugated intermediate portion interconnecting the peripheral and central portions.

* * * * *